(12) United States Patent
Chen et al.

(10) Patent No.: US 6,768,646 B1
(45) Date of Patent: Jul. 27, 2004

(54) HIGH DENSITY INTERNAL BALL GRID ARRAY INTEGRATED CIRCUIT PACKAGE

(75) Inventors: Fung Leng Chen, Singapore (SG); Chee Kiang Yew, Singapore (SG); Pang Hup Ong, Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 09/115,444

(22) Filed: Jul. 14, 1998

(Under 37 CFR 1.47)

(51) Int. Cl.[7] .......................... H05K 1/00; H05K 1/18; H05K 7/02; H05K 7/06; H05K 7/08
(52) U.S. Cl. ..................... 361/748; 361/767; 257/777
(58) Field of Search .......................... 361/748–750, 361/760–764, 767–770, 730, 803, 688, 792, 692, 735; 174/260–264, 250, 254, 52.1; 257/777–780, 734, 737, 738, 723, 724, 668

(56) References Cited

U.S. PATENT DOCUMENTS

| | | | | |
|---|---|---|---|---|
| 3,179,913 | A | 4/1965 | Mittler et al. ................. | 339/18 |
| 3,370,203 | A | 2/1968 | Kravitz et al. ............... | 317/101 |
| 3,459,998 | A | 8/1969 | Focarile ...................... | 317/100 |
| 3,904,934 | A | 9/1975 | Martin ........................ | 317/101 |
| 4,288,841 | A | 9/1981 | Gogal ......................... | 361/414 |
| 4,502,098 | A | 2/1985 | Brown et al. ................ | 361/383 |
| 4,560,962 | A * | 12/1985 | Barrow ........................ | 333/1 |
| 4,574,331 | A | 3/1986 | Smolley ...................... | 361/393 |
| 4,646,128 | A | 2/1987 | Carson et al. ................ | 357/74 |
| 4,727,410 | A | 2/1988 | Higgins, III ................. | 357/74 |
| 4,823,233 | A | 4/1989 | Brown et al. ................ | 361/383 |
| 4,833,568 | A | 5/1989 | Berhold ...................... | 361/383 |
| 4,843,225 | A * | 6/1989 | Hoppe ......................... | 235/492 |
| 4,862,249 | A | 8/1989 | Carlson ....................... | 357/80 |
| 4,868,712 | A | 9/1989 | Woodman .................... | 361/388 |
| 4,953,005 | A | 8/1990 | Carlson et al. ............... | 357/80 |
| 5,016,138 | A | 5/1991 | Woodman .................... | 361/381 |
| 5,019,945 | A | 5/1991 | Smolley ...................... | 361/412 |
| 5,258,330 | A | 11/1993 | Khandros et al. | |
| 5,313,366 | A * | 5/1994 | Gaudenzi et al. ........... | 361/760 |
| 5,398,863 | A | 3/1995 | Grube et al. | |
| 5,512,786 | A * | 4/1996 | Imamura et al. ............. | 257/780 |
| 5,536,909 | A | 7/1996 | DiStefano et al. | |
| 5,619,017 | A | 4/1997 | Distefano et al. | |
| 5,640,048 | A * | 6/1997 | Selna .......................... | 257/738 |
| 5,679,977 | A | 10/1997 | Khandros et al. | |
| 5,682,061 | A | 10/1997 | Khandros et al. | |
| 5,767,446 | A * | 6/1998 | Ha et al. ..................... | 174/52.4 |
| 5,777,391 | A * | 7/1998 | Nakamura et al. ........... | 257/778 |
| 5,796,170 | A * | 8/1998 | Marcantonio ................ | 257/786 |
| 5,801,446 | A | 9/1998 | DiStefano et al. | |
| 5,886,876 | A * | 3/1999 | Yamaguchi .................. | 361/767 |
| 5,973,393 | A * | 10/1999 | Chia et al. ................... | 257/690 |
| 5,977,618 | A | 11/1999 | DiStefano et al. | |
| 6,054,755 | A * | 4/2000 | Takamichi et al. ........... | 257/667 |
| 6,054,756 | A | 4/2000 | DiStefano et al. | |
| 6,075,710 | A * | 6/2000 | Lau ............................. | 361/760 |
| 6,080,932 | A | 6/2000 | Smith et al. | |
| 6,133,627 | A | 10/2000 | Khandros et al. | |
| 6,211,572 | B1 | 4/2001 | Fjelstad et al. | |
| 6,239,384 | B1 | 5/2001 | Smith et al. | |
| 6,265,759 | B1 | 7/2001 | DiStefano et al. | |
| 6,272,744 | B1 | 8/2001 | DiStefano et al. | |
| 6,284,563 | B1 | 9/2001 | Fjelstad | |
| 6,309,915 | B1 | 10/2001 | Distefano | |

* cited by examiner

*Primary Examiner*—Evan Pert
*Assistant Examiner*—Tuan Dinh
(74) *Attorney, Agent, or Firm*—Frederick J. Telecky, Jr.; W. James Brady, III

(57) ABSTRACT

An integrated circuit package (30) comprising a substrate (70) having peripheral openings (86) and first and second surfaces (92, 94), a plurality of routing strips (82) being integral with the substrate (70), a plurality of pads (100) centrally disposed on the first surface (92) and electrically connected with at least one of the routing strips (82), a chip (50) having bonding pads (120) adhered to the second surface (84) of the substrate (70), wire bonding (80) electrically connecting at least one bonding pad (120) to at least one of the routing strips (82) and potting material (90) filling the openings (86) to adhere the chip (50) to the substrate (70) and surrounding the wire bonding (80), is disclosed.

20 Claims, 1 Drawing Sheet

HIGH DENSITY INTERNAL BALL GRID ARRAY INTEGRATED CIRCUIT PACKAGE

TECHNICAL FIELD OF THE INVENTION

The present invention relates in general to the field of integrated circuit packages and more specifically to substantially flat integrated circuit packages having multiple slots around the perimeter of the substrate for wire bonding and attachment of a silicon chip and having a ball grid array disposed on the substrate internal of the multiple slots.

BACKGROUND OF THE INVENTION

Without limiting the scope of the invention, its background is described in connection with integrated circuit packages, as an example.

Heretofore, in this field, integrated circuits have been formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are packaging related.

The integrated circuit must be packaged in a suitable media that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to a lead frame, where, following wire bonding and encapsulation, designated parts of the lead frame become the terminals of the package. The packaging of integrated circuits has also involved the placement of chips on a flexible board where, following adhesion of the chip to the surface of the flexible board and wire bonding, an encapsulant is placed over the chip and the adjacent flexible board to seal and protect the chip and other components.

Unfortunately, current methods for encapsulating silicon chips have led to various problems, including cracking between the encapsulation material and the integrated circuit components, as well as high failure rates due to the multi-step nature of the process. Cracking has plagued the industry because of differences in the coefficient of thermal expansion of the different components, for example, between the soldering materials at the different interfaces and between metallic and non-metallic components. Cracking is also frequent between the silicon wafer and the encapsulation materials, usually epoxies, due to the extreme variations in temperature in various environments and between periods of operation and non-operation.

Even if the encapsulated silicon chip is successfully assembled into a working integrated circuit, another problem is commonly encountered. Once the silicon chip is encapsulated it is typically surface mounted using radiant heat or vapor saturated heating. This process, however, can lead to poor coplanarity due to uneven reflow, leading to integrated circuit failure.

Therefore, a need has arisen for an integrated circuit package and a process for producing an integrated circuit package that provides for minimizing the size of integrated circuit packages. A need has also arisen for an integrated circuit package that allows for wire bonding of the silicon chip to the printed circuit board around the perimeter of the printed circuit board while providing maximum protection to the critical components of the integrated circuit package. Also, a need has arisen for an integrated circuit package that utilizes the surface area toward the center of the printed circuit board for attachment of a high density ball grid array. Finally, a need has arisen for an integrated circuit package that solves the problem caused by the differences in thermal expansion of the packaging materials and does not require extensive encapsulation.

SUMMARY OP THE INVENTION

The present invention disclosed herein comprises an integrated circuit package that utilizes slots around the perimeter of the substrate for wire bonding the silicon chip to the substrate. The integrated circuit package of the present invention also utilizes the region of the printed circuit board inside the slots for locating a high density ball grid array. The present invention reduced the differences in the coefficient of thermal expansion of the packaging components by having a substrate with multiple opening filled with potting material.

The integrated circuit package comprises a substrate having two or more openings disposed proximate the perimeter of the substrate, first and second surfaces and an outline. A plurality of routing strips are integral with the substrate. A plurality of pads are centrally disposed on the first surface, at least one of the pads being electrically connected with at least one of the routing strips. A chip is adhered to the second surface of the substrate. The chip has an outline that is less than the outline of the substrate. The chip has at least one bonding pad, which serves to provide electrical connections to the substrate. Wire bonding electrically connects the bonding pad to the routing strips through the openings on the substrate. The wire bonding is protected from the environment by a potting material that is disposed within the openings in the substrate.

The chip is adhered to the substrate by the potting material that may be, for example, polyimide. Alternatively, the chip may be adhered by an adhesive layer, such as a polyimide adhesive layer or an adhesive epoxy tape. The epoxy can either be coated on the surface of the substrate or the chip prior to assembly.

Solder balls are disposed on the pads of the first surface of the substrate to enable attachment to other devices. The solder balls may preferably have a diameter between about 8 and 20 mils. The chip may preferably have a thickness between about 10 and 20 mils. In one embodiment, potting material encapsulates the chip adding a thickness of about 6 mils. The substrate may preferably have a thickness between about 8 and 28 mils. In a single layer embodiment, the substrate has a thickness of about 12 mils.

In a multi-layer embodiment, the integrated circuit package of the present invention has bus bars and routing strips are disposed adjacent to the openings of the substrate. The first layer may have a thickness of about 12 mils and a second layer may have a thickness of about 8 mils. Alternatively, a first layer may have a thickness of about 12 mils, a second layer may have a thickness of about 8 mils and a third layer may have a thickness of about 8 mils. The profile of the integrated circuit package of the present invention may preferably be between about 30 mils and 50 mils.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is related to high frequency integrated circuit packages having both a low profile and a small outline. As defined herein, the term "outline" relates to the overall width and length of, for example, the entire integrated circuit package of the present invention. The outline of the integrated circuit package is also referred to as the footprint of the integrated circuit package, because it defines the surface area on a motherboard that the integrated circuit package will occupy. Outline may be measured, in for example, square mils or square millimeters.

As defined herein, the term "profile" refers to thickness or height of, for example, the integrated circuit package of the present invention. The integrated circuit package of the present invention may be measured in, for example, mils. As defined herein, the term "substantially similar" refers to the relative outlines of the printed circuit board and the silicon chip, which are within less than about 10% of one another. In one embodiment of the present invention, the difference in the outlines is about 2%. In an alternative embodiment, the silicon chip and the printed circuit board have the same outlines. Importantly, the term substantially similar does not indicate which of the two components is larger, as either form is encompassed by the present invention.

The present invention provides for an integrated circuit package that delivers high speed performance and meets the space constraint requirements of modern semiconductors. The present invention also addresses the problems associated with the electronic capacity of the chip assembly. The principles of the present invention may be incorporated into, for example, a synchronous DRAM (SDRAM) silicon chip. However, the present invention is also applicable to LOGIC, SRAM, EPROM and any other integrated circuit components.

Figure 1:
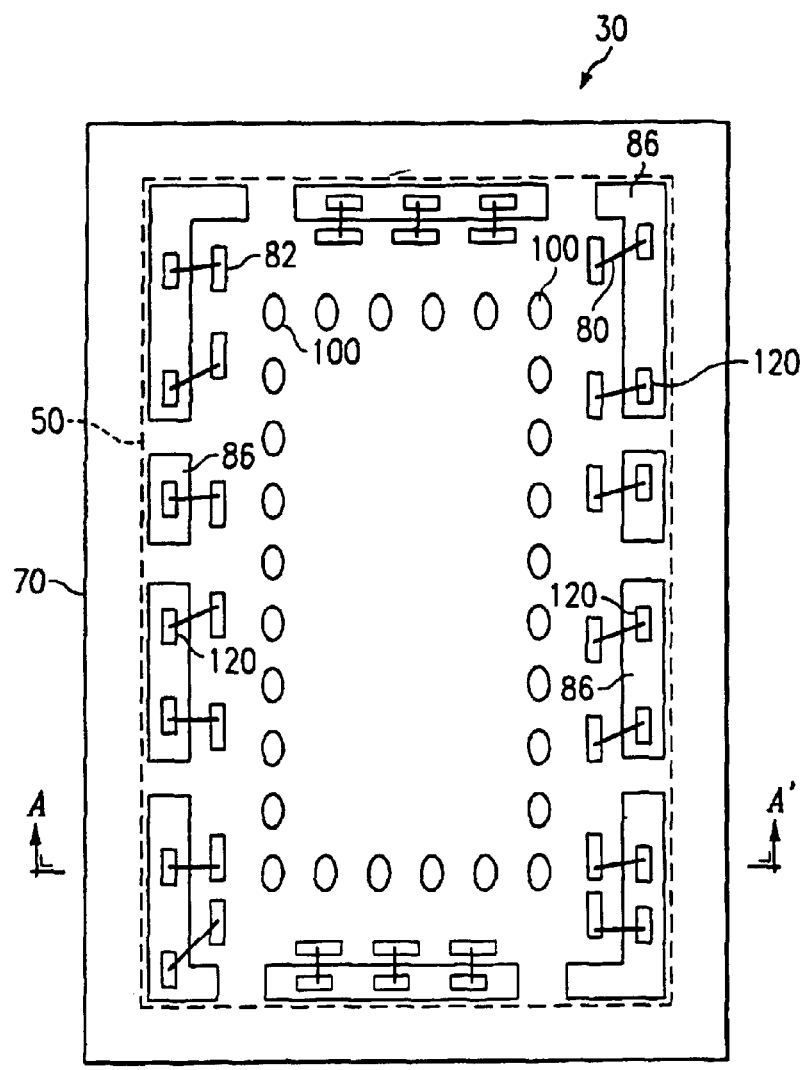
FIG. 1 is a simplified top view of an integrated circuit package of the present invention.

FIG. 1 is a top view depicting the outline of an integrated circuit package 30 of the present invention. A printed circuit board 70 is depicted having openings 86 around the perimeter of printed circuit board 70. The number of openings 86 may be varied up or down depending on design or assembly constraints such as the thickness, width, length, coefficient of thermal expansion and composition of the printed circuit board 70. Pads 100 are centrally located on the printed circuit board 70 and are connected to routing strips 82 by conduits and vias (not depicted) within the printed circuit board 70. The silicon chip 50 has bonding pads 120 located generally in the outer areas of silicon chip 50 surrounding the periphery of the silicon chip 50. Bonding pads 120 are connected to routing strips 82 of printed circuit board 70 by wire bonding 80.

The printed circuit board 70 of the present invention may be varied in thickness to allow more flexibility than conventional printed circuit boards 70. The increased flexibility allows the printed circuit board 70 of the present invention to more closely match the movement and expansion of the silicon chip 50. By filling the openings 86 with a potting material 90 that closely matches the coefficient of thermal expansion of the silicon chip 50 or the printed circuit board 70, or both, stress caused by thermal expansion on the components is reduced. Reduced stress on the components increases the yield during packaging, and also increases device reliability and endurance.

Bus-bars (not depicted) may be included in the printed circuit board 70. The bus bars may serve, for example, as power supplies or grounds, and it is preferred that one bus bar serve one function, such as a power supply, and a second bus bar serve another function, such as a ground.

Figure 2:
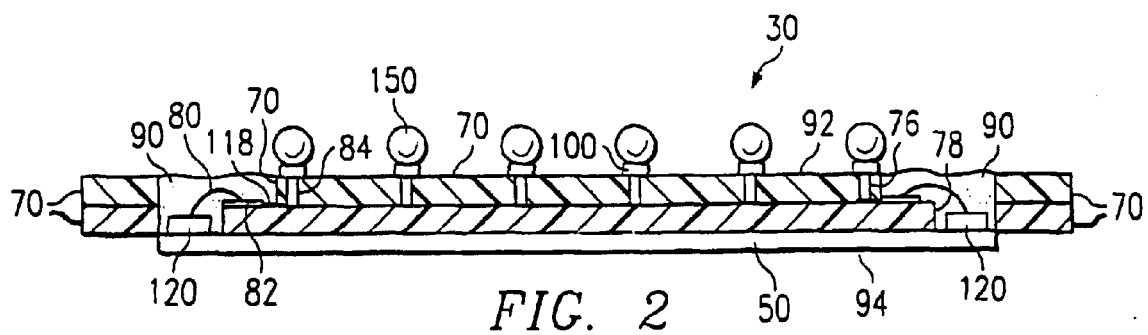
FIG. 2 is a simplified end cross-sectional view of an integrated circuit package of the present invention along the A–A' line of FIG. 1.

FIG. 2 is a simplified cross-sectional view of an integrated circuit package taken along the A–A' line depicted in FIG. 1 that is generally designated 30. The integrated circuit package 30 comprises a silicon chip 50, which can be, for example, any integrated circuit component such as a DRAM, an EPROM, a SRAM or a LOGIC chip. A printed circuit board 70 is attached to the silicon chip 50 by the potting material 90. If necessary, an adhesive layer (not depicted) may be placed between the printed circuit board 70 and the silicon chip 50. The printed circuit board 70 depicted has two layers, a top layer 76 and a bottom layer 78.

It should be understood by one skilled in the art that the terms "top" and "bottom" as well as the terms "side" and "end" are used for illustration purposes only, as the integrated circuit package 30 of the present invention can be assembled and used in a variety of positions and ways.

The printed circuit board 70 may be constructed from a material such as FR-4, FR-5 or BR. FR-4, for example, is available from Motorola Inc., U.S.A., and is an epoxy resin reinforced with a woven glass cloth. In selecting the material for printed circuit board 70, one skilled in the art will recognize that four parameters should be considered, namely: thickness, dielectric constant, glass transition temperature and the coefficient of thermal expansion.

The thickness of top layer 76 and bottom layer 78 is dependant on the number of layers required to electrically connect bonding pads 120 on silicon chip 50 and the pads 100 on the first surface 92 of the printed circuit board 70. The thickness of the layers will also depend on the amount of reinforcement required in a given layer. The reinforcing glass cloth can range in thickness from 2 mil per sheet (type 106) to about 8 mil per sheet (type 7628). Dielectric constant is determined by a combination of the resin used and the thickness and type of reinforcement used. Standard FR-4 has a dielectric constant of about 4.5. The dielectric constant can be reduced to about 3 by replacing the epoxy resin with a cyanate ester resin. The greater the thickness, however, the greater the problems associated with thickness control, rough surfaces, excessive drill reflection and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for printed circuit boards having a $T_g$ above 250° C.

The coefficient of thermal expansion for FR-4 is about 16 ppm/° C. A difference in the coefficient of thermal expansion between the printed circuit board 70 made from FR-4 and the silicon chip 50 can lead to failure of the integrated circuit package 30 during, not only the assembly of the integrated circuit package 30, but also during its use.

Solder balls 150 are used with the present invention, and may be attached to the pads 100 forming a high density ball grid array in the center of printed circuit board 70. A conventional solder reflow system, for example, a vapor phase solder reflow system may be used to attach solder balls 150 to pads 100. In this system, condensed vapor surrounds the integrated circuit package 30 and the printed circuit board 70 with a cloud of steam. A liquid, such as a nonchlorinated (non CFC) fluorocarbon is first heated with enough energy to form a vapor and to sustain a vapor cloud. When the integrated circuit package 30 is then passed through the vapor, the vaporized liquid condenses thereon and gives off the latent heat of vaporization. This energy is then transferred to the integrated circuit package 30. As long as the integrated circuit package 30 remains in the vapor, the vapor continues to give off energy at a repeatable fixed rate and temperature, until the integrated circuit package 30 reaches the temperature of the vapor.

The advantage of using a nonchlorinated fluorocarbon is that it is extremely thermally stable, colorless, odorless and nonflammable. In addition, it has a low toxicity, low surface temperature, low boiling point, and low heat of vaporization. Because the fluid form of the non-chlorinated fluorocarbon is inert, it does not react with fluxes or component materials, nor does it absorb oxygen or other gases that cause reactions during the solder reflow. Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the temperatures for reflux of non-chlorinated fluorocarbons and the composition of the solder types that are used is shown below.

Vaporization Temperatures and Solder Types

| Fluid Temperature | Solder Type |
|---|---|
| 56, 80, 97, 101, 102° C. and 155° C. | 100 In |
|  | 37 Sn/38 Pb/25 In |
| 165° C. | 70 Sn/18 Pn/12 In |
|  | 70 In/30 Pb |
| 174° C. | 60 In/40 Pb |
| 190° C. | 90 In/10 Ag |
|  | 50 In/50 Pb |
|  | 63 Sn/37 Pb |
|  | 70 Sn/30 Pb |
|  | 60 Sn/40 Pb |
| 215° C. and 230° C. | 60 Sn/40 In |
|  | 60 Sn/40 Pb |
|  | 63 Sn/37 Pb |
|  | 70 Sn/30 Pb |
|  | 62 Sn/36 Pb/2 Ag |
| 240° C. and 253° C. | 75 Pb/25 In |
|  | 81 Pb/19 In |
| 260° C. and 265° C. | 96.5 Sn/3.5 Ag |

Alternatively, infrared or radiant heated solder reflow may be used to place solder balls 150 on pads 100. In such a system each component of the soldering system is directly exposed to radiation from a heating element. Heat from the radiant energy element is absorbed by the different components according to its molecular structure, leading to bonding between the pads 100 and solder balls 150.

Conventional radiant heat systems expose only the outer surfaces of the components to the radiant heat, which may not reach interior areas as efficiently as with vapor saturated heating methods as described above. The present invention, however, is not affected by this typical problem because of the use of solder balls 150 instead of leads. In fact, due to the reduced overall size either method, vapor phase solder reflow or radiant heated solder reflow, may be effectively used with the present invention.

The multi-slot printed circuit board 70 of the present invention also solves other problems associated with solder reflow systems. These problems include the creation or failure due to voids, coplanarity, tombstoning, open joints, component cracking, thermal shock and thermal stressing. The present invention solves these problems because the potting material 90 serves to attach the printed circuit board 70 to silicon chip 50. The multi-slot printed circuit board 70 also dispenses with the need for electrically connecting soldering leads to the integrated circuit package 30.

By using solder balls 150 instead of leads, the problems associated with voids around pad areas or under leads caused by incomplete reflow or poor welding of the soldering surface due to improper flux or badly oxidized surfaces is eliminated. The problems of coplanarity and tombstoning are also reduced or eliminated using the solder balls 150 because surface tension on both sides of the solder balls 150 is equal.

Even though FIG. 2 depicts printed circuit board 70 as having two layers, top layer 76 and bottom layer 78, it should be understood by one skilled in the art that printed circuit board 70 may consist of a single layer or may be a multi-layered board having an alternate number of layers. Furthermore, FIG. 2 shows a conduit 118 connecting routing strip 82 to via 84. In one alternative embodiment, via 84 connects directly to routing strip 82 without a need for conduit 118. Conduit 118, however, may be useful for connecting together a plurality of pads 100 or routing strips 82.

The above described components and their constructions and interrelation provide an assembly that is encapsulated as described below. The term "assembly" refers to the assembled components prior to encapsulation. The assembly consists of printed circuit board 70, a silicon chip 50 and wire bonding 80. The printed circuit board 70 has openings 86 with routing strips 82 and bus bars extending into, or to, the openings 86. Disposed on the upper surface 92 of printed circuit board 70, and more specifically top layer 76, are pads 100 on which solder balls 150 or solder columns are positioned for providing electrical connection to a mother- or sister-board.

The wire bonding 80 process may begin after silicon chip 50 has been adhered to printed circuit board 70. Silicon chip 50 and printed circuit board 70 are then positioned on a heated pedestal to raise the temperature of the combination to a point between 100°–300° C. A gold wire having a diameter typically ranging from 0.7 mil. to 1.3 mil. is strung through a heated capillary where the temperature may range between 200°–500° C. A soldering ball is created at the end of the wire using either a flame or a spark technique. This soldering ball is then brought to bonding pad 120 on the silicon chip 50 and a combination of compression force and ultrasonic energy are used to create the desired metallurgical bond.

Using this "stitch" technique significantly reduces the cross-section of the wire at that point. A loop is created in the wire bonding 80 above the bond that has just been achieved, and the wire bonding 80 is routed to the desired connection on the printed circuit board 70 such as routing strip 82 or bus bar. The wire bonding 80 is clamped and the capillary raised, such that the wire bonding 80 will break free at the outer edge of the bond. This process is repeated until all the bonding pads 120 that require electrical connection on the silicon chip 50 are electrically connected to printed circuit board 70.

Following the assembly of the above-described components, the openings 86 are filled with potting material 90. The potting material 90 may attach the printed circuit board 70 to the silicon chip 50 if an adhesive layer is not disposed between the printed circuit board 70 and the silicon chip 50. The potting material 90 fills the openings 86 and protects the wire bonding 80 from the environment. The potting material 90 also helps protect the wire bonding 80 from mechanical stress, and provides mechanical support. By using potting material 90 to fill the openings 86 and protect the wire bonding 80, the integrated circuit package 30 of the present invention may be produced with less steps and has decreased warpage caused by the use of the potting materials 90 to adhere and encapsulate the component of the integrated circuit package 30. By using a printed circuit board 70 having a plurality of openings 86, the printed circuit board is exposed to less stress than in conventionally potted and encapsulated integrated circuit packaging because the potting material 90 can be selected to more closely match the coefficient of thermal expansion of the printed circuit board 70 and the silicon chip 50.

The potting material 90 may be a cyanate ester-type resin available from Shin-Etsu Chemical Co., Ltd., such as KMC 184VA and KMC 188VA-4. Other examples of potting materials 90 that may be used with the present invention include epoxies, polyesters, polyimides, cyanoacrylates, ceramic, silicone and urethane. The potting materials 90 may also contain fillers that affect the coefficient of thermal expansion, as well as the strength and flexibility of the potting material 90. The selection of potting material 90 and fillers will depend on the components used to make the integrated circuit package 30, as will be known to those of skill in the art.

Properties of Typical Potting Resins

|  | Epoxy | Polyester | Silicone | Urethane |
|---|---|---|---|---|
| Dielectric constant, D-150 |  |  |  |  |
| 60 Hz | 3.9 | 4.7 | 2.7 | 5.7 |
| $10^6$ Hz | 3.2 | — | 2.7 | 3.4 |
| Dissipation factor, D-150 |  |  |  |  |
| 60 Hz | 0.04 | 0.017 | 0.001 | 0.123 |
| $10^6$ Hz | 0.03 | — | 0.001 | 0.03 |
| Dielectric strength, D-149; |  |  |  |  |
| V/mil | 450 | 325 | 550 | 400 |
| Volume resistivity, D-257; |  |  |  |  |
| $\Omega \cdot$ cm | $10^{15}$ | $10^{14}$ | $10^{15}$ | $10^{13}$ |
| Arc resistance, D-495; seconds | 150 | 135 | 120 | 180 |
| Specific gravity, D-792 | 1.15 | 1.2 | 1.05 | 1.0 |
| Water absorption, D-570; % 24 h | 0.15 | 0.3 | 0.12 | 0.4 |
| Heat deflection temperature, |  |  |  |  |
| D-648; at 264 lb/in$^2$, ° F. | 380 | 260 | <70 | <70 |
| Tensile strength, D-638; lb/in$^2$ | 9000 | 10,000 | 1000 | 2000 |
| Impact strength (Izod), D-256; |  |  |  |  |
| ft · lb/in | 0.5 | 0.3 | No break | No break |
| Coefficient of thermal expansion, |  |  |  |  |
| D-969; $10^{-5}$/° F. | 5.5 | 7.5 | 4.0 | 15 |
| Thermal conductivity, C-177; |  |  |  |  |
| Btu · in/(h.ft$^2$.° F.) | 1.7 | 1.7 | 1.5 | 1.5 |
| Linear shrinkage; % | 0.3 | 3.0 | 0.4 | 2.0 |
| Elongation, D-638; % | 3 | 3 | 175 | 300 |

The present invention, therefore, is directed toward an integrated circuit package 30 having openings 86 around the perimeter of printed circuit board 70 allowing for a high density ball grid array to be disposed around the center of printed circuit board 70 while having an overall reduction in outline and profile. The present invention also allows for decreased failure due to the reduced number of soldered materials having varying coefficients of thermal expansion. The present invention further reduces the overall number of steps in the assembly of, for example, memory units by streamlining the assembly process not only in reduced number of steps, but also by elimination the curing steps associated with a potting step followed by an encapsulation step. The present invention further reduces the amount of material, and the types of materials used in producing integrated circuit packages 30, thereby saving time, money and the environment.

Furthermore, the present invention takes advantage of the openings 86 in the printed circuit board 70 for potting the wire bonding 80 that connects the silicon chip 50 and the printed circuit board 70 in a single step, and to decrease the stress caused by varying coefficients of thermal expansion. By filling the openings 86 with potting material 90, the wire bonding 80 between silicon chip 50 and the printed circuit board 70 is generally protected from the environment in general, and more particularly, protected from moisture due to the hermetic nature of the encapsulation. By filling the openings 86, the integrated circuit package 30 of the present invention minimizes warpage caused by the differences in the coefficients of thermal expansion between the printed circuit board 70 and the silicon chip 50.

The potting and encapsulation of the integrated circuit package 30 of the present invention as described herein also reduces the overall profile by allowing the non-operative or backside of the silicon chip 50 to be exposed. A smaller profile is achieved while at the same time providing for hermetical protecting of the connections between the silicon chip 50 and the printed circuit board 70, at the openings 86. Additionally, reduced environmental impact is obtained using the apparatus of the present invention due to the overall decrease in the size of the integrated circuit package 30.

While this invention has been described in reference to illustrative embodiments, this description is not intended to be construed in a limiting sense. Various modifications and

What is claimed is:

1. An integrated circuit package comprising:
    a multilayer substrate comprising a top layer having a top surface and a bottom layer having a bottom surface opposite said top surface, said top and said bottom layers having a plurality of overlapping peripheral openings, wherein said openings are larger in said top layer than in said bottom layer such that a portion of a top surface of said bottom layer is exposed;
    a plurality of routing strips on said top surface of said bottom layer, wherein at least one of said routing strips is on said exposed portion of said top surface of said bottom layer;
    a chip adhered to said bottom surface of said bottom layer of said substrate;
    a plurality of electrical conductors physically attached to said chip and located such that each electrical conductor in said plurality of electrical conductors is aligned within a respective one of said plurality of peripheral openings in said substrate;
    a plurality of pads disposed on said top surface of said top layer of said substrate generally centralized within said peripheral openings of said substrate; and
    potting material filling said peripheral openings.

2. The integrated circuit package as recited in claim 1 wherein at least one of said pads disposed on said top surface of said top layer of said substrate is electrically connected with said at least one of said routing strips.

3. The integrated circuit package as recited in claim 1 further comprising at least one solder ball disposed on one of said pads.

4. The integrated circuit package as recited in claim 1 further comprising a plurality of solder balls disposed on said pads.

5. The integrated circuit package as recited in claim 1 wherein said potting material adheres said chip to said substrate.

6. The integrated circuit package of claim 1 wherein each of the plurality of conductors comprises a bonding pad.

7. The integrated circuit package as recited in claim 2 wherein at least one of said pads disposed on said top surface of said top layer of said substrate is electrically connected with said at least one of said routing strips with a via through said top layer of said substrate.

8. An integrated circuit package comprising:
    a multilayer substrate comprising a top layer having a top surface and a bottom layer having a bottom surface opposite said top surface, said top and said bottom layers having a plurality of overlapping peripheral openings, wherein said openings are larger in said top layer than in said bottom layer such that a portion of a top surface of said bottom layer is exposed;
    a plurality of routing strips on said top surface of said bottom layer, wherein at least one of said routing strips is on said exposed portion of said top surface of said bottom layer;
    a plurality of pads disposed centrally on said top surface, at feast one of said pads being electrically connected with said at least one of said routing strips;
    potting material filling said plurality of peripheral openings;
    a chip having a plurality of bonding pads physically attached to the chip and located such that each bonding pad in said plurality of bonding pads is aligned within a respective one of said plurality of peripheral openings in said substrate; and
    wire bonding electrically connecting said chip to said substrate between at least one of said bonding pads and said at least one of said routing strips on said exposed portion of said top surface of said bottom layer.

9. The integrated circuit package as recited in claim 8 further comprising at least one solder ball disposed on one of said pads.

10. The integrated circuit package as recited in claim 8 further comprising a plurality of solder balls disposed on said pads.

11. The integrated circuit package as recited in claim 8 wherein said chip has a thickness between about 10 and 20 mils.

12. The integrated circuit package as recited in claim 8 wherein said substrate has a thickness of between about 8 and 28 mils.

13. The integrated circuit package as recited in claim 8 wherein said substrate has first and second layers and wherein said first layer has a thickness of about 12 mils and said second layer has a thickness of about 8 mils.

14. The integrated circuit package as recited in claim 8 wherein said at least one of said pads being electrically connected with said at least one of said routing strips is connected by a via through said top layer of said substrate.

15. The integrated circuit package as recited in claim 9 wherein said at least one solder ball is between about 8 and 20 mils in diameter.

16. An integrated circuit package comprising:
    a substrate having a plurality of peripheral openings, first and second surfaces and an outline;
    a plurality of routing strips being integral with said substrate;
    a plurality of pads centrally disposed on said first surface at least one of said pads being electrically connected with said routing strips;
    a chip adhered to said second surface of said substrate, said chip having an outline that is substantially the same as said outline of said substrate and having a plurality of bonding pads physically attached to the chip and located such that each bonding pad in said plurality of bonding pads is aligned within a respective one of said plurality of peripheral openings in said substrate;
    wire bonding electrically connecting said bonding pads to said routing strips;
    vias connecting said routing strips to said pads;
    potting material filling said peripheral openings and covering said wire bonding and said bonding pads; and
    a plurality of solder balls centrally disposed on said pads disposed on said first surface of said substrate.

17. The integrated circuit package as recited in claim 16 wherein said chip has a thickness between about 10 and 20 mils.

18. The integrated circuit package as recited in claim 16 wherein said substrate has a thickness of between about 8 and 28 mils.

19. The integrated circuit package as recited in claim 16 wherein said substrate has first and second layers and wherein said first layer has a thickness of about 12 mils and said second layer has a thickness of about 8 mils.

20. The integrated circuit package as recited in claim 19, wherein said peripheral openings in said second layer are larger than the peripheral openings in said first layer, such that a portion of a top surface of said first layer is exposed in each of said peripheral openings in said second layer.

* * * * *